(12) United States Patent
Takeuchi et al.

(10) Patent No.: US 6,894,888 B2
(45) Date of Patent: May 17, 2005

(54) MULTILAYER BOARD HAVING PRECISE PERFORATIONS AND CIRCUIT SUBSTRATE HAVING PRECISE THROUGH-HOLES

(75) Inventors: Yukihisa Takeuchi, Nishikamo-Gun (JP); Hiroyuki Tsuji, Nagoya (JP); Kazumasa Kitamura, Itinomiya (JP); Yoshinori Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/784,558

(22) Filed: Feb. 23, 2004

(65) Prior Publication Data

US 2004/0163849 A1 Aug. 26, 2004

Related U.S. Application Data

(63) Continuation of application No. 10/160,998, filed on Jun. 3, 2002, now abandoned.

(30) Foreign Application Priority Data

Jun. 7, 2001 (JP) ...................................... 2001-172188

(51) Int. Cl.$^7$ .............................................. H01G 4/228
(52) U.S. Cl. .............................. 361/306.1; 361/306.3; 361/321.1; 361/321.2; 361/301.4; 361/311; 361/313
(58) Field of Search .......................... 361/306.1, 306.3, 361/301.1, 301.4, 303, 308.1, 311, 313, 321.1, 321.2, 307

(56) References Cited

U.S. PATENT DOCUMENTS

| | | | |
|---|---|---|---|
| 4,665,468 A | * | 5/1987 | Dohya ......................... 361/794 |
| 4,675,789 A | | 6/1987 | Kuwabara et al. |
| 5,118,458 A | | 6/1992 | Nishihara et al. |
| 5,286,926 A | | 2/1994 | Kimura et al. |
| 5,320,721 A | | 6/1994 | Peters |
| 5,451,721 A | | 9/1995 | Tsukada et al. |
| 5,487,218 A | | 1/1996 | Bhatt et al. |
| 5,628,502 A | | 5/1997 | Amarakoon |
| 5,965,043 A | | 10/1999 | Noddin et al. |
| 6,119,335 A | | 9/2000 | Park et al. |
| 6,323,435 B1 | | 11/2001 | Strandberg et al. |
| 6,323,439 B1 | | 11/2001 | Kambe et al. |
| 6,337,463 B1 | | 1/2002 | Gaku et al. |
| 6,359,255 B1 | | 3/2002 | Yamamoto et al. |
| 6,452,117 B2 | | 9/2002 | Curcio et al. |
| 6,463,831 B1 | | 10/2002 | DiMaria |
| 6,502,302 B2 | | 1/2003 | Takeuchi et al. |
| 6,546,624 B2 | | 4/2003 | Echigo et al. |
| 6,549,395 B1 | * | 4/2003 | Naito et al. ............... 361/306.1 |
| 6,637,102 B2 | | 10/2003 | Takeuchi et al. |
| 2002/0166425 A1 | | 11/2002 | Takeuchi et al. |

FOREIGN PATENT DOCUMENTS

| | | |
|---|---|---|
| GB | 1 228 651 | 4/1971 |
| JP | 09-019914 A1 | 1/1997 |

OTHER PUBLICATIONS

Proceedings of 3rd International Conference on Multichip Moudles, SPIE vol. 2256, Denver, CO, Apr. 13–15, 1994, 1994, pp. 173–181, XP008033939, Reston, VA ISHM–Microelectronic Society, USA.

* cited by examiner

*Primary Examiner*—Dean A. Reichard
*Assistant Examiner*—Nguyen T. Ha
(74) *Attorney, Agent, or Firm*—Burr & Brown

(57) ABSTRACT

An intermediate laminated structure is provided including a plurality of unfired ceramic plates stacked along a laminating direction. Each of the plates has a plurality of holes formed therethrough by a punching operation. At least a first hole in one of the plurality of unfired ceramic plates has the same shape and cross-sectional area as respective first holes in the remaining plurality of unfired ceramic plates such that the first holes define a cylinder of constant cross-sectional area throughout the entire thickness of the intermediate laminated structure.

20 Claims, 14 Drawing Sheets

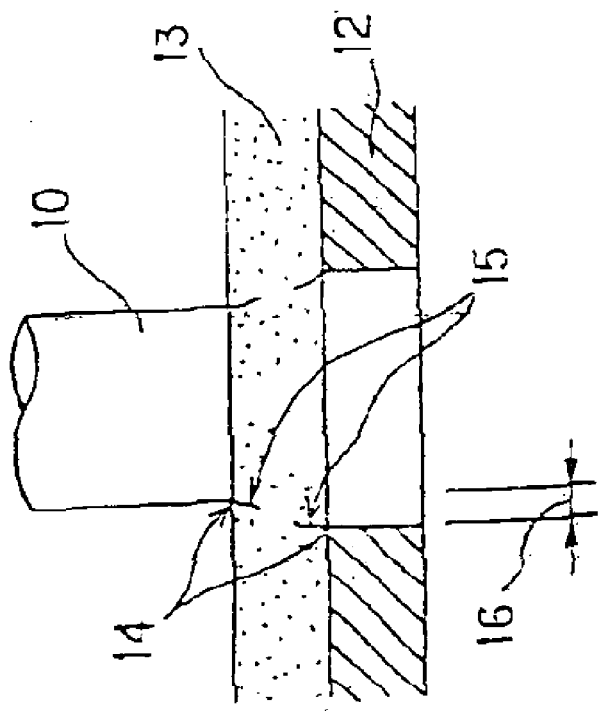
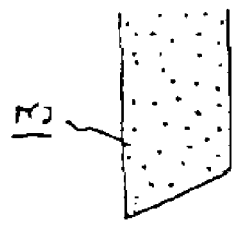
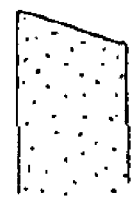
FIG. 3 (a) - Prior Art
FIG. 3 (b) - Prior Art

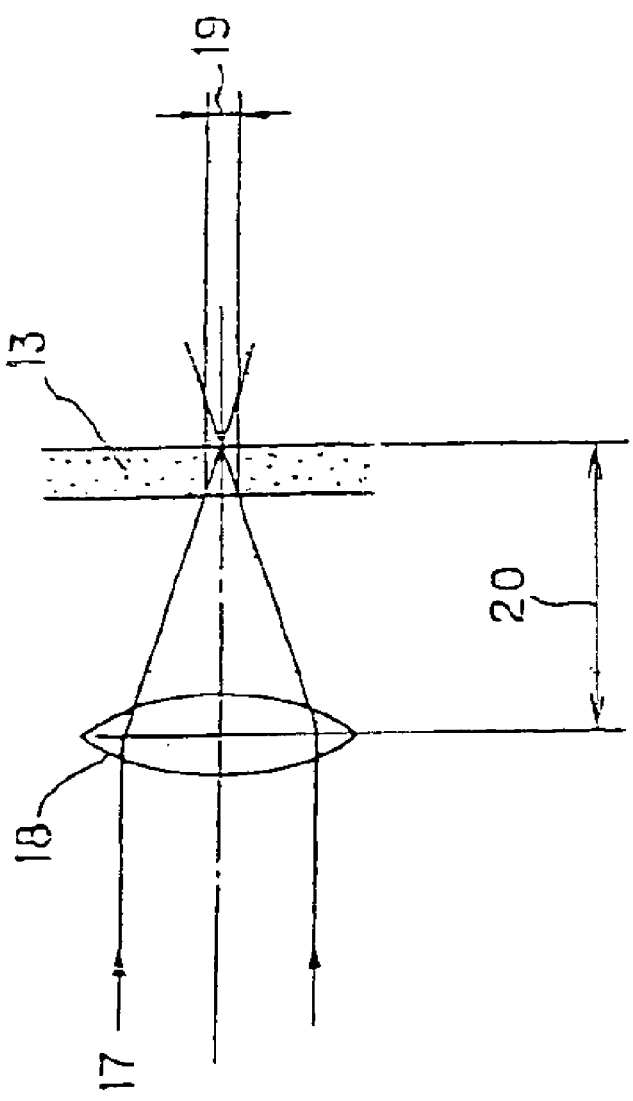
FIG. 4(a) - Prior Art
FIG. 4(b) - Prior Art

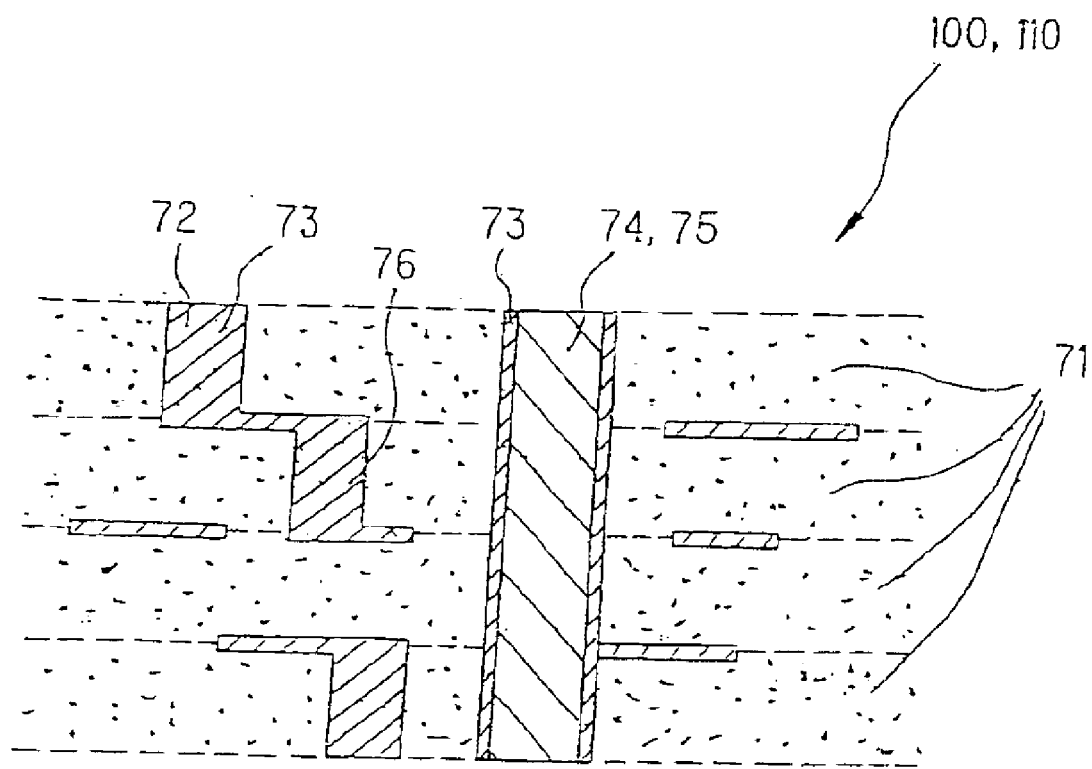
FIG. 10 - Prior Art

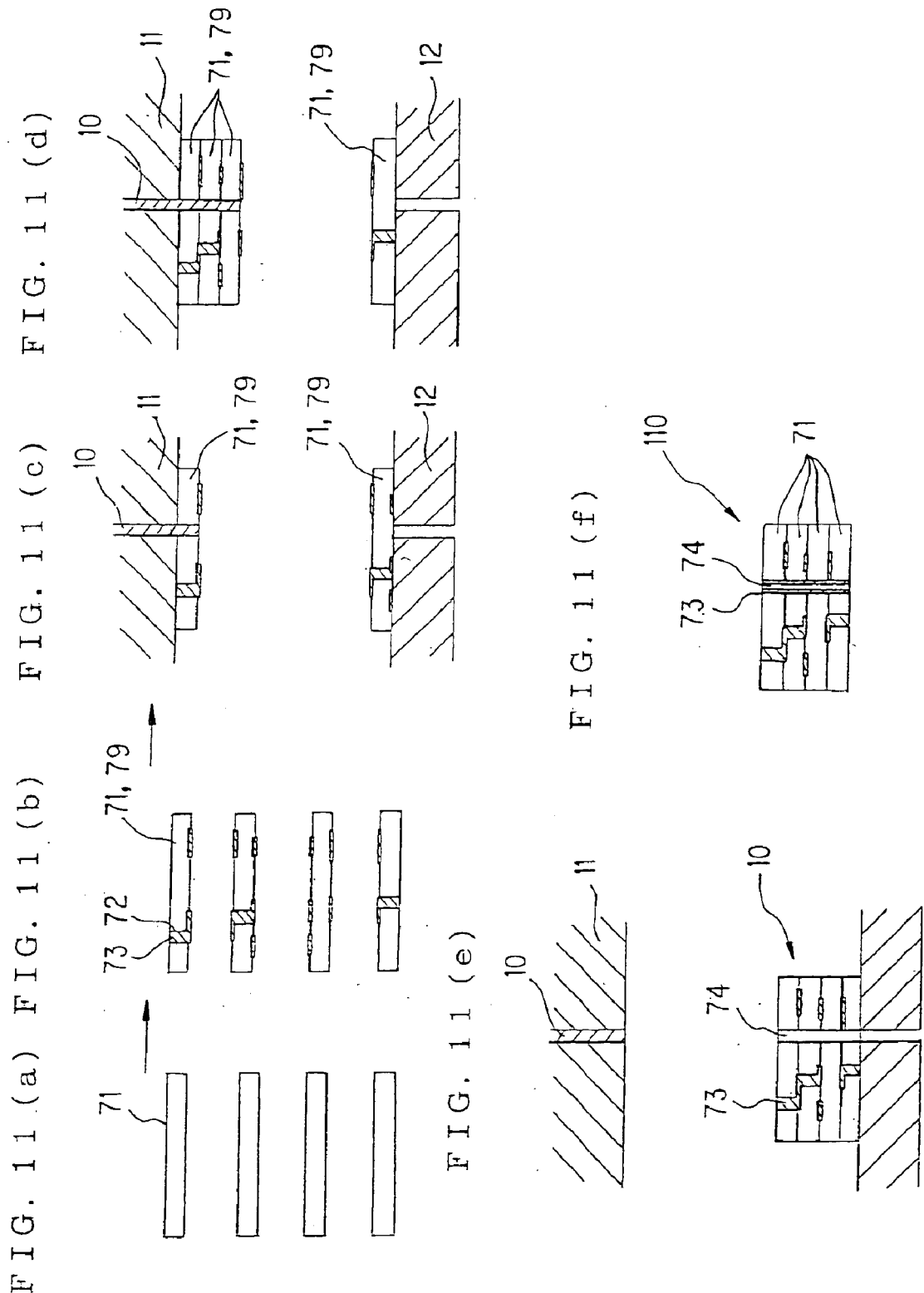

MULTILAYER BOARD HAVING PRECISE PERFORATIONS AND CIRCUIT SUBSTRATE HAVING PRECISE THROUGH-HOLES

CROSS-REFERENCE TO RELATED APPLICATIONS

This application is a continuation of U.S. patent application Ser. No. 10/160,998, filed on Jun. 3, 2002 now abandoned, and claims the benefit of Japanese Application 2001-172188 filed Jun. 7, 2001, the entireties of which are incorporated herein by reference.

BACKGROUND OF THE INVENTION

1. Field of the Invention

The present invention relates to a multilayer board having perforations which are formed precisely in spite of a high aspect ratio of the perforations. The present invention also relates to a stacked circuit substrate to improve wiring density and having through-holes which are formed precisely in spite of a high aspect ratio of the through-holes.

2. Description of the Related Art

There is a demand for boards of a predetermined thickness and having a plurality of small, long and narrow perforations precisely formed therein. For example, in case of conductive vias in a wiring board for mounting electronic components thereon, an ink discharge portion of an inkjet printer, and the like, fine perforations having a diameter of not greater than an order of several tens to several hundreds of micrometers are required to be accurately and precisely formed. This is because of the common requirement that all industrial products are less expensive, lighter, and smaller. Therefore, since compactness puts an additional value to industrially produced articles, high integration in packaging circuits, parts, and so forth is now in progress. That is, more small perforations must be formed over a smaller fixed area. With these backgrounds, the perforations are getting smaller and longer. Accordingly, in the perforations, as the diameter thereof becomes smaller and smaller, and as the axial length thereof becomes longer and longer, the aspect ratio (L/D) thereof becomes higher and higher.

In general, the term "aspect ratio" means a ratio of an axial length of a perforation to a diameter thereof when the perforation has a cylindrical shape, otherwise "aspect ratio" means a ratio of the axial length of the perforation to the minimum distance between the opposing edges on the opening of the perforation. Here, the term "minimum distance between the opposing edges on the opening of the perforation" means the minimum distance S shown in FIGS. 5(a) or 5(b). That is, the expression "a perforation having a high aspect ratio" means a long narrow bore having a relatively small diameter (or a relatively small minimum distance between the opposing edges on the opening of the perforation) and a comparatively long axial length. Known methods for fabricating a perforation having such a high aspect ratio have a variety of problems.

(A) Problems in Die-Punching Processes

One of the known methods for forming a small perforation in a plate or a sheet (hereinafter referred to as a plate) is by die-punching, that is, to punch a plate having a predetermined thickness by using a punch and a die. Since this method requires a large clearance between the punch and the die, perforations with poor precision are often obtained. Also, in the case that a thick plate is punched, a large shearing force is applied thereon, especially when the perforations are to be formed densely in the thick plate and the die is required to have a large number of bores. Therefore, the die is often insufficient to bear the large shearing force and is deformed due to insufficient stiffness. In the worse cases, the die is broken due to the insufficient stiffness.

FIGS. 3(a) and 3(b) illustrate perforating a plate by a known die-punching method. As shown in FIG. 3(a), when a punch 10 punches a plate 13 placed on a die 12 while providing a clearance 16 between two lines extending along two edges 14 of the punch 10 and the die 12, a crack 15 occurs in the region of the clearance 16, thereby causing a variation in precision of the perforation in the region of the clearance 16. Consequently, the method for forming a perforation by die-punching generally causes the perforation in the punched plate 13 to have a tapered sectional shape widening toward the punching direction as shown in FIG. 3(b). Furthermore, the thicker the plate 13, the larger the clearance 16 is required to be, causing the perforation to have lower precision.

(B) Problems with Laser Processing

Another known method is to perforate a plate by laser processing. Since a laser beam is employed in this process, the perforation is formed by condensing a beam light in a lens and irradiating a target material with the condensed light beam. Therefore, in this laser beam processing, the perforation formed has a tapered shape that narrows in the traveling direction of the beam light as a result of the condensing method itself, which is a basic principal of this laser processing method. Accordingly, there is the fatal problem that as the aspect ratio of the perforation increases, the precision of the perforation decreases.

FIGS. 4(a) and 4(b) illustrate perforating a plate by known laser processing. As shown in FIG. 4(a), in a laser processing machine, a parallel beam 17 passes through a condenser 18, and is condensed at a focal point on a focal distance 20 from the condenser 18 so as to process the target material. The farther the target material is placed from the focal point, the wider a laser beam width 19 becomes, resulting in a larger diameter of the processed perforation. Accordingly, when a perforation is being formed on the output side of the plate 13 in the traveling direction of the beam, the diameter of the perforation formed on the input side of the plate 13 would become larger, while it would be varied, depending on the thickness of the plate 13. This would result in forming a perforation having a tapered shape that narrows in the traveling direction of the beam light as shown in FIG. 4(b).

In addition, thermal energy used for laser processing causes the plate, as a work piece, to be deformed and to thereby form a degeneration layer, leading to a problem of a variation in the diameter of the perforation. In this problem, as the thickness of the plate increases, the precision of the perforation becomes lower, since larger laser beams, i.e., laser beams having a larger amount of thermal energy, are required when the plate is thicker.

(C) Problems with Drilling

Further, another known perforation formation method is drilling. During the drilling process, chips produced by drilling are discharged outside through a drilled bore, causing a problem in which the chips hit the inner surface of the bore when traveling in the drilling direction of the drilled bore and accordingly widen the bore. Especially when the plate is made from a soft, plastic-deformable material, the precision of the perforation is likely to deteriorate. The higher an aspect ratio of the perforation, the longer the discharging path for the chips becomes, resulting in even lower perforation precision.

(D) Problems with Stacking Plates after being Perforated

An improved fabrication method is to perforate thin plates one by one, for example, by one of the above known methods, and then to displace and stack the perforated plates so as to achieve a multilayer board having a predetermined thickness. In this method, the bore of a single plate is more precise since the plate to be perforated at one perforating step is thin. Accordingly, it was considered that a perforation formed in the multilayer board fabricated by stacking the perforated thin plates is highly precise even when the perforation has a high aspect ratio.

However, the above method requires an additional jig for displacing the thin plates, an additional space for stacking the thin plates, and an additional step, which lowers production efficiency and increases production costs. Also, a guide pin is required for precise stacking, ending up as an extra bore in each thin plate in addition to the perforation necessary for the plates. Furthermore, a thin plate especially made from a soft material is easily deformed while being displaced and stacked, thereby causing the bore to be deformed. Accordingly, when the perforation is formed in the multilayer board having a predetermined thickness by aligning the bores perforated in the stacked thin plates, the precision of the perforation becomes lower. Therefore, a further improvement is desired, since there is a limitation on the precision of the perforation formed in the plates having a predetermined thickness.

A further elucidation will be made by taking as a specific example a circuit substrate represented by a printed wiring board and the like.

It has been eagerly desired to form a through-hole (perforation) having a more preciseness in a circuit substrate. Here, the term "a through-hole" means a bore passing through from the top to the bottom of the circuit board. For example, many of the latest wiring boards are multilayered in response to the requirement for high density integration. In general, a multilayer printed wiring board is formed by stacking circuit conductors with insulators. The conductive vias are formed in the insulators for electrically connecting the adjacent conductors, i.e., circuits on different layers, with each other by interposing the corresponding insulators between the circuits. A through-hole is also formed, passing through all the layers, so as to act to connect the conductors to achieve interlayer connection together with the vias.

The through-hole is mainly used to connect the outermost layers of the stacked conductors with each other after formation of the conductivity therein, for example, by copper plating. The through-hole is expected to prevent defects such as an electrical disconnection and an increase in resistance in order to prolong the duration of life and improve the reliability of the circuit substrate. Therefore, the through-hole is filled with and sealed by an insulating material such as an epoxy resin if required so as to prevent occurrence of cracks and the like caused by an external disturbance such as thermal expansion or stress during the fabrication or the practical use.

However, in the case of the conventional multilayer printed wiring board having a sealed through-hole therein, there still remains a problem of lowered yields due to cracks in the through-hole. As discussed below, it was presumed that trouble with the precision of the through-hole of conventional multilayer printed wiring boards was attributed to the fabrication method of the board. An exemplary multilayer printed wiring board and an exemplary known method for fabricating the board will be described below.

FIG. 10 is a sectional view of an exemplary multilayer printed wiring board. A multilayer printed wiring board 100 comprises insulator 71 of four plates stacked in four layers. The plates are composed of, for example, an epoxy resin and a glass cloth, and the circuit is a conductor 73 made from, for example, copper. The circuit, i.e., the conductors 73, which are interposed between the corresponding insulator 71 layers, are connected with each other by corresponding conductive vias 76 passing through the insulator 71. Also the multilayer printed wiring board 100 has a through-hole 74 passing through the four layered insulator 71 and the through-hole 74 is provided with conductivity by plating, for example, copper serving as the conductor 73. In addition, the through-hole 74 is sealed with filler 75 such as an epoxy resin. The through-hole 74 has a substantially cylindrical shape, a diameter ranging from about 50 to 100 $\mu$m, an axial length, i.e., a thickness of the multilayer printed wiring board 100, ranging from about 500 to 1000 $\mu$m, and an aspect ratio of about 10:1.

Such a multilayer printed wiring board can be fabricated, for example, as described below.

(1) First Example Fabrication Method

FIGS. 7(a) to 7(e) illustrate an example of a known fabrication method. Four plates for the insulator 71 are prepared as shown in FIG. 7(a). In a perforating step shown in FIG. 7(b), each plate of the insulator 71 is provided with respective via-holes 72 and holes 77 perforated therein; the holes 77 becoming the through-hole 74 after stacked. Perforation is usually performed by a known method such as a punching die, a laser, a drill and the like. Then, in a conductive-path forming step shown in FIG. 7(c), the via-hole 72 is filled with the conductor 73, and a thin film of the conductor 73 is formed on the inner surface of the hole 77. Conductive-path forming is usually performed by a known method such as screen printing or plating. In a circuit forming step shown in FIG. 7(d), a circuit having a predetermined pattern is formed with the conductor 73 formed on the insulator 71. Circuit forming is usually performed by a chemical process (photo etching) including resist-applying, exposing, developing, and etching; however, screen printing, plating, and so forth can be applied. In a stacking step shown in FIG. 7(e), the four plates of the insulators 71 having previously designed respective circuits formed in the steps illustrated in FIGS. 7(a) to 7(d) are stacked so that the multilayer printed wiring board 70 having the through-hole 74 passing through from the top to the bottom of the stacked plates is formed.

The multilayer printed wiring board can be fabricated by the following method having an order of steps different from that of the first exemplary fabrication method.

(2) Second Example Fabrication Method

FIGS. 8(a) to 8(e) illustrate another example of a known fabrication method. Four plates of the insulator 71 are prepared as shown in FIG. 8(a). In a circuit forming step shown in FIG. 8(b), only the via-holes 72 are perforated in the insulators 71, and the holes 77 to be acting as the through-holes 74 are formed after the insulator plates are stacked. Each of the via-holes 72 is filled with the conductor 73, and a circuit having a predetermined pattern is formed with the conductor 73 on each of the insulators 71. In a stacking step shown in FIG. 8(c), the four insulators 71 having previously designed circuits formed in the step illustrated in FIG. 8(b) are stacked to give a laminate 78. Subsequently, in a perforating step shown in FIG. 8(d), the through-holes 74 are perforated through each layer of the laminate 78. Finally, in a conductive-path forming step shown in FIG. 8(e), a film of the conductor 73 is formed on an inner surface of the through-hole so that a multilayer printed wiring board 80 having the through-hole 74 passing through from the top to the bottom of the laminate 78 is given.

As for the above described fabrication methods, when a laminate is provided with the through-hole 74 by forming the holes 77 in the plates and stacking the holes 77 according to the first exemplary fabrication method described (1), the precision of each of the holes 77 is high. However, the problems caused by stacking after being perforated as described above remain unsolved. That is, a displacement (i.e., a stepped portion) is formed between the stacked plates when the insulators 71 having the conductors (circuits) 73 formed thereon are stacked. When a thick stacked laminate is perforated according to the second exemplary fabrication method, however, the problems described with respect to die-punching, laser processing, drilling, and stacking after perforated remain unsolved. As a result, the precision of the through-hole 74 is limited in many cases.

Accordingly, cracking and/or pealing of the conductor is likely to occur at the step portions of the through-hole formed at stacked portions due to external disturbances such as thermal expansion and stress, which causes troubles such as an electrical disconnection or an increase in resistance, thereby leading to the shortened life time and the lowered reliability of a circuit substrate. In particular, such troubles are likely to occur in a circuit substrate densely mounted on a computer packaged, since the circuit substrate is stacked in several tens of layers.

When the through-hole of the circuit substrate is actually wider or narrower beyond a designed tolerable value, the circuit substrate is defective since the circuit substrate has a conducting portion which was originally designed to be insulative or an insulating portion which was originally designed to be conductive. This trouble is likely to occur in a printed wiring board stacked in several tens of layers as described above, since it is required to have the predetermined thickness.

Furthermore, the reduced smoothness of the inner surface of the through-hole due to the step portions at the stacked portions causes an increase in resistance and noise generated due to inductance and/or capacitance components. Such noise can be fatal to a circuit substrate used for a computer having an energy-saving circuit therein in which an extremely minute electric current flows. A circuit substrate having a precise through-hole in which the step portions at the stacked portions of the through-hole are small prevents these problems.

As described above, multilayer wiring boards, for example, having an extremely fine, long, narrow, and precise through-hole, a multilayer board having a predetermined thickness and a precise perforation with a high aspect ratio have been required, even when the multilayer board is formed from a soft material deformable due to its dimensions or its shape. However, there has been no proposal for achieving such a multilayer board.

SUMMARY OF THE INVENTION

In view of the above problems, the present invention is made to solve the problems related to the known art. More particularly, it is an object of the present invention to provide a multilayer board having a predetermined thickness and having a fine and precise perforation having a small diameter, for example, of 100 $\mu$m or less, and a relatively long axial length, wherein the ratio of the axial length of the perforation to the diameter of the perforation is greater than or equal to a fixed ratio. To be more specific, it is an object of the present invention to provide a circuit substrate, such as a printed wiring board, having a precise through-hole, even when the through-hole has a high aspect ratio, so as to achieve a higher density in the field of packaging technology used for an electronic device and so forth.

In accordance with one aspect of the present invention, there is provided a multilayer board comprising a plurality of stacked plates and a plurality of precisely formed perforations in the stacked plates, wherein the perforations have a surface-profile precision of 8 $\mu$m or less. The ratio of the axial length of the perforation to the diameter of the perforation, or to the minimum distance between the opposing edges on the opening surface of the perforation, preferably lies in a range of about 1:1 to about 15:1. Also, the ratio of the axial length of the perforations to the spacing between the adjacent perforations preferably lies in the range of about 1:1 to 15:1.

In the multilayer board according to the above aspect of the present invention, the diameter of the perforation, or the minimum distance of the opposing edges on the opening surface of the perforation is preferably equal to 100 $\mu$m or less, and the spacing between the adjacent perforations is preferably equal to 100 $\mu$m or less.

In addition, the plates may comprise an insulating material comprising a plastic resin or a ceramic, or an insulating compound material of a plastic resin and a ceramic. In this case, the ceramic includes not only a sintered ceramic, but also a green ceramic which is formed after adding a plasticizer to raw ceramic powder. The plate preferably has a Young's modulus of 3000 kgf/mm$^2$ or less and a tensile strength of 20 kgf/mm$^2$ or less.

In accordance with another aspect of the present invention, there is provided a multilayer board comprising a plurality of stacked plates and a plurality of precisely formed perforations which are formed in the plates by a punching machine comprising a punch, a die, and a stripper, and which have a surface-profile precision of 8 $\mu$m or less. The multilayer board is fabricated by the following steps: (a) preparing a required number of the plates, (b) forming a first bore in the first plate by the punch and pulling up the first plate by closely attaching the first plate to the stripper while leaving the punch in the first bore, (c) forming a second bore in the second plate by the punch and pulling up the second plate together with the first plate while leaving the punch in the second bore, and (d) repeating forming bores in the following plates and stacking the punched plates along the punch serving as a stacking axis sequentially until the predetermined number of plates is stacked.

In accordance with still another aspect of the present invention, a circuit substrate is provided, comprising a plurality of conductors, a plurality of insulators for insulating the conductors and at least one through-hole passing through all the conductors and insulators, wherein the conductors and the insulators are stacked and the through-hole has a surface-profile precision of 8 $\mu$m or less.

In accordance with yet another aspect of the present invention, a circuit substrate is provided comprising a plurality of conductors, a plurality of insulators for insulating the conductors, stacked together with the conductors and at least one through-hole which passes through all the insulators and the conductors, which is formed by a punching machine comprising a punch, a die, and a stripper, and which has a surface-profile precision of 8 $\mu$m or less. The circuit substrate is fabricated in the following steps: (a) preparing a plurality of wiring boards comprising an insulating material and having respective circuits formed thereon, (b) forming a first hole in the first wiring board by the punch and pulling up the first wiring board by closely attaching the first wiring board to the stripper while leaving the punch in the first hole, (c) forming a second hole in the second wiring board by the punch and pulling up the second wiring board together with the first wiring board while leaving the punch in the second hole, and (d) forming holes in the following wiring boards and stacking the formed wiring boards along the punch serving as a stacking axis sequentially until the predetermined number of wiring boards is stacked.

In accordance with still another aspect of the present invention, a circuit substrate is provided comprising (1) a base substrate and (2) at least one build-up layer formed on at least one side of the base substrate. The base substrate comprises (i) a plurality of conductors, (ii) a plurality of insulators for insulating the conductors, stacked together with the conductors, and (iii) at least one through-hole formed therein, passing through all the conductors and insulators. The build-up layer comprises (iv) at least one conducting layer; and (v) at least one insulating layer stacked together with the conducting layer alternately, wherein the through-hole has a surface-profile precision of 8 $\mu$m or less.

In accordance with still another aspect of the present invention, a circuit substrate is provided comprising (1) a base substrate and (2) at least one build-up layer formed on at least one side of the base substrate. The base substrate comprises (i) a plurality of conductors, (ii) a plurality of insulators for insulating the conductors, stacked together with the conductors, and (iii) at least one through-hole formed therein, passing through all the conductors and insulators. The build-up layer comprises (iv) at least one conducting layer, and (v) at least one insulating layer stacked together with the conducting layer alternately. The through-hole is formed by a punching machine comprising a punch, a die, and a stripper and has a surface-profile precision of 8 $\mu$m or less. The circuit substrate is fabricated in the following steps: (a) preparing a plurality of wiring boards comprising an insulating material and having respective circuits formed thereon; (b) forming a first hole in the first wiring board by the punch and pulling up the first wiring board by closely attaching the wiring board to the stripper while leaving the punch in the first hole; (c) forming a second hole in the second wiring board by the punch and pulling up the second wiring board together with the first wiring board while leaving the punch in the second hole; (d) repeating forming holes in the following wiring boards and stacking the punched wiring boards along the punch serving as a stacking axis sequentially until the predetermined base substrate is formed; and (e) forming the build-up layers on thus fabricated base substrate.

As described above, the present invention provides a multilayer board, which has a fine perforation having a small diameter of, e.g., 100 $\mu$m or less and an axial length, wherein the ratio of the diameter to the axial length is greater than or equal to a fixed ratio. That is, a small and precisely formed perforation having a high aspect ratio is provided in a multilayer board, which has a predetermined thickness, even when a deformable and soft material is used for the multilayer board. A circuit substrate such as a printed wiring board having a precise through-hole is provided even when the through-hole has a high aspect ratio. Accordingly, the multilayer board and the circuit substrate according to the present invention offer an excellent advantage for mounting parts and the like more densely.

BRIEF DESCRIPTION OF THE DRAWINGS

FIGS. 2(a) and 2(b) illustrate a multilayer board having precise perforations according to an embodiment of the present invention, wherein FIG. 2(a) is a perspective view of the exemplary multilayer board and FIG. 2(b) is an enlarged perspective view of the perforations shown in FIG. 2(a).

FIGS. 3(a) and 3(b) illustrate a method of perforating a plate by a known die-punching method, wherein FIG. 3(a) is a schematic view illustrating the cracking in the plate to be perforated and FIG. 3(b) illustrates a sectional shape of the perforation in the perforated plate.

FIGS. 4(a) and 4(b) illustrate a method of perforating a plate by a known laser processing method, wherein FIG. 4(a) is a schematic view illustrating perforating the plate by laser beam processing, and FIG. 4(b) is an illustration of a sectional shape of the perforation in the plate processed by the laser beam.

FIGS. 5(a) and 5(b) illustrate a precise perforation which is provided in a multilayer board according to the present invention, wherein FIG. 5(a) illustrates an exemplary minimum distance of the perforation and FIG. 5(b) illustrates another exemplary minimum distance of the perforation.

FIGS. 9(a) to 9(e) illustrate a method for fabricating a multilayer board having precise perforations by die-punching according to the present invention, wherein FIG. 9(a) illustrates a first preparing step in which a first thin plate is placed on a die, FIG. 9(b) illustrates a first punching step for punching the first plate, FIG. 9(c) illustrates a second preparing step in which a second thin plate is placed on the die, FIG. 9(d) illustrates a second punching step for punching the second plate, and FIG. 9(e) illustrates a final step, in which the stacked plates are removed from a stripper when all the plates are punched and stacked, for completing the punching process.

FIG. 10 is a sectional view of another known circuit substrate.

FIGS. 11(a) to 11(f) illustrate a method for fabricating a circuit substrate having a precise through-hole by die-punching according to the present invention, wherein FIG. 11(a) is a step for preparing insulating plates, FIG. 11(b) is a circuit forming step for obtaining single-layer wiring boards by providing the respective insulating plates with circuits by using a conductive material, FIG. 11(c) illustrates a first perforating and stacking step in which a first wiring board is perforated and a second wiring board is placed on the die, FIG. 11(d) illustrates a third perforating and stacking step in which a third wiring board is perforated and a fourth wiring board is placed on the die, FIG. 11(e) illustrates a final step, in which the punched wiring boards are removed from the stripper and are placed on the die after all the wiring boards are punched and stacked, for completing the punching and stacking process by obtaining a laminate, and FIG. 11(f) illustrates a conductive-path forming step for providing the obtained laminate with conductivity.

FIGS. 12(a) to 12(f) illustrate an exemplary method, in which an external shim is employed, for fabricating a multilayer board having precise perforations by die-punching according to the present invention, wherein FIG. 12(a) illustrates a first preparing step in which a first thin plate-like material to be punched is placed on the die, FIG. 12(b) illustrates a first punching step for punching the first plate, FIG. 12(c) illustrates a second preparing step in which a second thin plate-like material to be punched is placed on the die, FIG. 12(d) illustrates a second punching step for punching the second plate, FIG. 12(e) illustrates a third preparing step in which a third thin plate-like material to be punched is placed on the die, and FIG. 12(f) illustrates a final step, in which the stacked plate-like materials are removed from the stripper when all the plate-like materials are punched and stacked, for completing the punching process.

FIGS. 13(a) to 13(f) illustrate an exemplary method, in which an elevation shim is employed, for fabricating a multilayer board having precise perforations by die-punching according to the present invention, wherein FIG. 13(a) illustrates a first preparing step in which a first thin plate-like material to be punched is placed on the die, FIG. 13(b) illustrates a first punching step for punching the first plate, FIG. 13(c) illustrates a second preparing step in which a second thin plate-like material to be punched is placed on the die, FIG. 13(d) illustrates a second punching step for punching the second plate, FIG. 13(e) illustrates a third preparing step in which a third thin plate-like material to be punched is placed on the die, and FIG. 13(f) illustrates a final step in which the stacked plate-like materials are removed from the stripper when all the plate-like materials are punched and stacked, for completing the punching process.

FIGS. 14(a) to 14(f) illustrate an exemplary method, in which another type of elevation shim is employed, for fabricating a multilayer board having precise perforations by die-punching according to the present invention, wherein FIG. 14(a) illustrates a first preparing step in which a first thin plate-like material to be punched is placed on the die, FIG. 14(b) illustrates a first punching step for punching the first plate, FIG. 14(c) illustrates a second preparing step in which a second thin plate-like material to be punched is placed on the die, FIG. 14(d) illustrates a second punching step for punching the second plate, FIG. 14(e) illustrates a third preparing step in which a third thin plate-like material to be punched is placed on the die, and FIG. 14(f) illustrates a final step, in which the stacked plate-like materials are removed from the stripper when all the plate-like materials are punched and stacked, for completing the punching process.

DETAILED DESCRIPTION OF THE INVENTION

Figure 1:
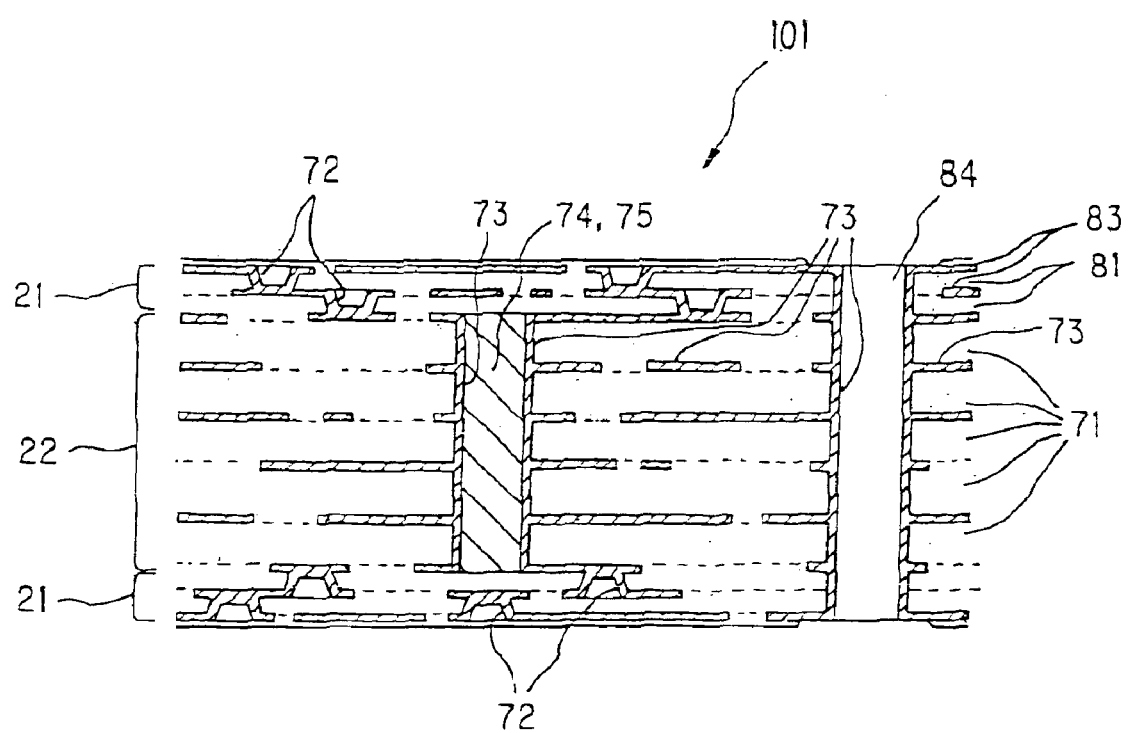
FIG. 1 is a sectional view of a circuit substrate according to the present invention.

A multilayer board having precise perforations and a circuit substrate having precise through-holes according to embodiments of the present invention will be described in detail; however, the present invention is not limited to these embodiments, but it will be apparent to one skilled in the art that the present invention can be changed, modified, or improved in various ways without departing from the spirit of the present invention.

In the present specification, the term "perforation" or "through-hole" means a bore which passes through all of a plurality of plates, wiring boards, insulators, or the like, e.g., having a given thickness, and the term "bore" or "hole" means a bore provided in every single plate, wiring substrate, insulator, or the like. The present invention is directed to all multilayer boards having precisely formed perforations and all circuit substrates having precisely formed through-holes. For example, even when the perforation or the through-hole is capped, or even when the top one or the bottom one of a plurality of plates, wiring boards, insulators, or the like having precise perforations or precise through-holes does not have a bore therein, all of them lie within the scope of the multilayer board having precise perforations and the circuit substrate having precise through-holes according to the present invention.

The multilayer board having a plurality of precise perforations according to the present invention is characterized in that the precision of the surface profile of the perforations is equal to 8 $\mu$m or less. In the multilayer board according to the present invention, even when the perforation is very fine, that is, for example, the diameter or the minimum distance of opposing edges on the opening surface is about 100 $\mu$m or less, and also the perforation has a high aspect ratio, that is, the ratio of the axial length of the perforation to the diameter of the perforation, or the minimum distance of opposing edges on the opening surface thereof, lies in the range of about 1:1 to 15:1, the foregoing surface-profile precision can be maintained. In addition, even when the ratio of the axial length of the perforation to the spacing between adjacent perforations is in the range of about 1:1 to about 15:1, or even when the multilayer board is densely provided with perforations having the spacing of 100 $\mu$m or less between the adjacent perforations, the forgoing surface-profile precision can be maintained.

(i) Method for Fabricating Multilayer Board According to the Present Invention

As will be described below, a multilayer board having precise perforations according to the present invention can be fabricated by using a punch and a die. FIGS. 9(a) to 9(e) illustrate an exemplary method for fabricating a multilayer board having precise perforations by die-punching according to the present invention. A punching machine comprises a punch 10, a die 12, and a stripper 11 as the major components thereof, and thin plates 3 are placed one by one on the die 12 and are perforated by the punch 10.

Figure 9:
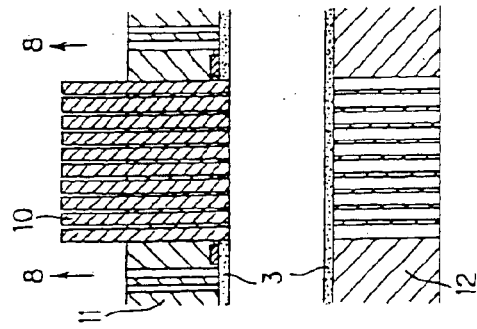
Figure 9:
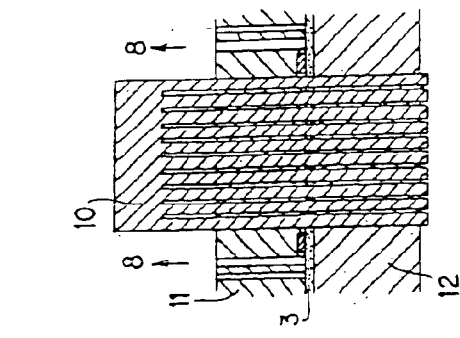
Figure 9:
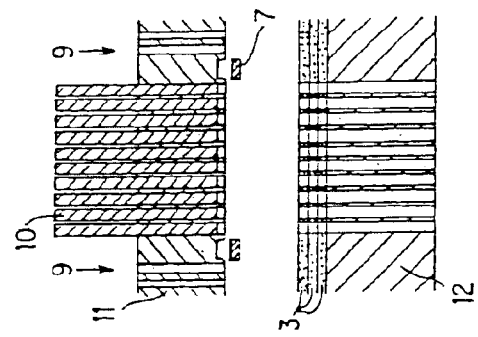
Figure 9:
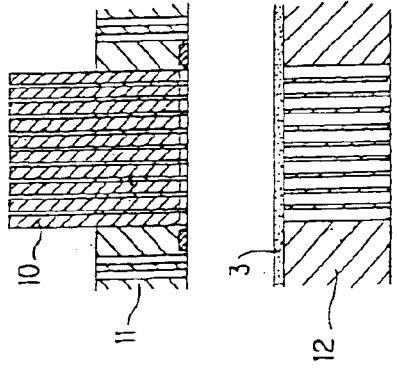
Figure 9:
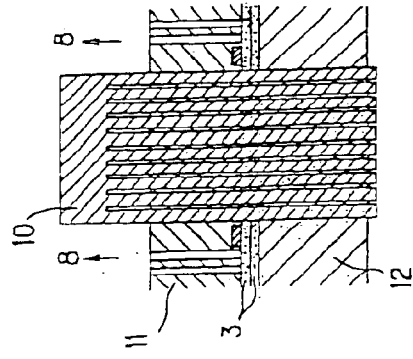

FIG. 9(a) illustrates a first thin plate 3 positioned on the die 12 in preparation for being punched. The first thin plate 3 is punched by the punch 10 as shown in FIG. 9(b). Then, the first punched plate 3 is moved upward by closely attaching it to the stripper 11 while leaving the punch 10 in the punched plate 3 in order to prepare for punching a second thin plate 3 as shown in FIG. 9(c). When the punch 10 and the stripper 11 are pulled up from the die 12 as shown in FIG. 9(c), the punch 10 is not returned to the middle point of the bore of the first plate 3 which is pulled up together with the punch 10. Stopping the punch 10 at a point slightly receded from the bottom surface of the first punched plate 3 is essential. Here, being slightly receded from the bottom surface means that the punch 10 does not at least project from the bottom surface. In this way, the punch 10 is used as an axis for stacking the plates 3 and also is used for preventing the bores formed by the punch 10 from being deformed.

FIG. 9(d) illustrates a second punching step for punching the second plate 3. Then, the preparing step for punching as shown in FIG. 9(c) and the punching step shown in FIG. 9(d) are repeatedly performed to obtain the second punched plate 3 and are sequentially stacked in the punching machine. When the predetermined number of the plates 3 are punched and stacked as illustratively shown in FIG. 9(e), wherein three plates having perforations are stacked finally, the stacked plates 3 are removed from the stripper 11.

According to the above-described fabrication method, stacking the plates along the punch as an axis allows the plates to act for holding and fixing the punch, thus the direction and the magnitude of the displacement between the center axes of the punch and the bore of the stripper are unchanged at every punching step. Also, the punch is left in the bores of the punched plate, thereby preventing chips from outside from entering the bores and also preventing chips produced by punching from being discharged through the bores. Accordingly, more precise perforations can be formed in the plates.

Although more precise bores can be obtained by repeating the punching step while stacking the punched plates along the punch in the above-described manner, plates made from a soft and deformable material may experience deterioration in precision of the bores. When punching, the stripper abuts against the plate lying on the die before the punch forms a bore in the plate, and the plate is sandwiched between the stripper and the die, thereby a compressing force being given to on the punched plates, which are stacked on the stripper, and the plate on the die to be punched. When the plates are made from a material which is easily deformed by compression, the plates stacked on the stripper are likely to be crushed and deformed, thereby causing a relative displacement between the punch and the plates since the punch acting as a stacking axis is fixed, resulting in the deteriorated precision of the shape of the formed bores. Also, the plate lying on the die is perforated by the punch while being crushed elastically between the die and the stripper abutting against the plate, thereby causing deteriorated precision of the position and the shape of the bore because an elastic deformation of the elastically crushed plate is released after the punching operation.

Punching the soft plate while interposing a spacer between the die and the stripper is preferable for more precise perforation. FIGS. 12(a) to 12(f), FIGS. 13(a) to 13(f), and FIGS. 14(a) to 14(f) illustrate exemplary methods for fabricating a multilayer board in which punching is performed while interposing respective spacers between the die and the stripper. Interposing a spacer prevents the stripper from abutting directly against the plate and thus prevents the plate from being compressed.

Figure 12A:
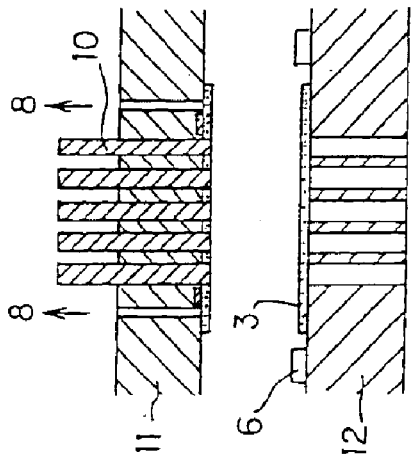
Figure 12B:
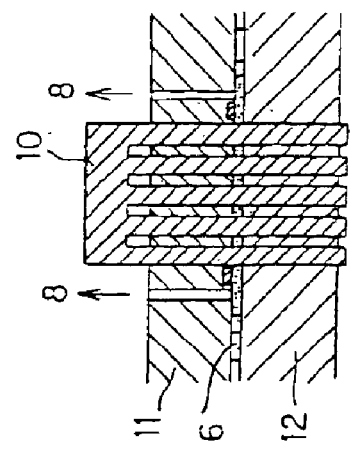
Figure 12C:
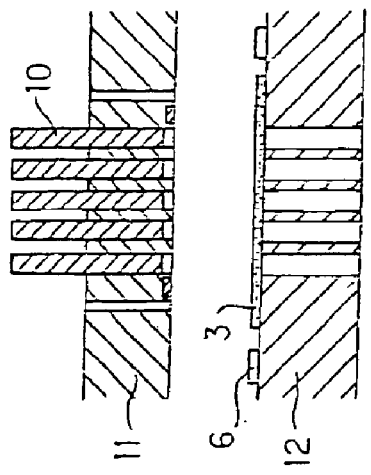
Figure 15:
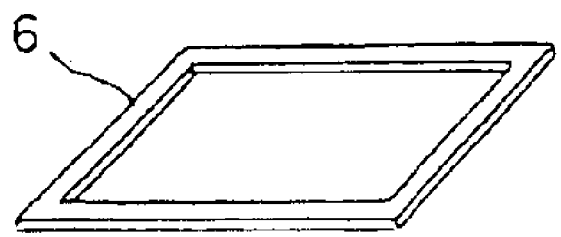
FIG. 15 is a perspective view of an exemplary external shim used in the steps shown in FIGS. 12(a) to 12(f).

FIGS. 12(a) to 12(f) illustrate a fabrication method in which an external shim 6 is used as a spacer by way of example. FIG. 12(a) illustrates the first thin plate 3 placed on the die 12 in preparation for being punched. The first external shim 6 having an exemplary shape shown in FIG. 15 is also placed on the die 12. A preferable thickness of the first external shim 6 is greater than that of the first plate 3 on the die 12 by about 5 to 15 µm. Then, the first plate 3 is punched by the punch 10 as shown in FIG. 12(b), wherein the stripper 11 does not abut directly against the first plate 3, but abuts against the first external shim 6 which is slightly thicker than the first plate 3. Accordingly, the first plate 3 made even from an extremely soft material is not deformed by punching, thereby allowing the first punched plate 3 to have a precise bore. Then, in a second preparing step illustrated in FIG. 12(c), the first punched plate 3 is moved upward by closely attaching it to the stripper 11 while leaving the punch 10 in the first punched plate 3, and the second external shim 6 is placed on the die 12. A preferable thickness of the second external shim 6 is greater than the total thickness of the first punched plate 3, which has been pulled up while leaving the punch 10 in the first punched plate 3, and the second plate 3 on the die 12 to be punched by about 5 to 15 µm.

Figure 12D:
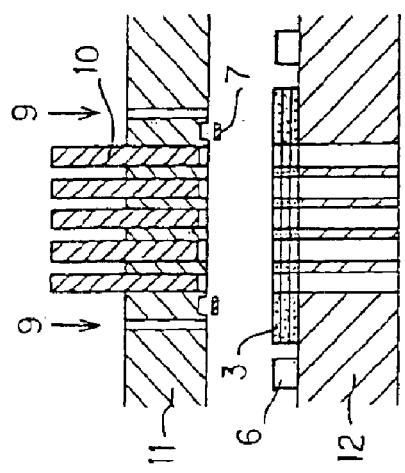
Figure 12E:
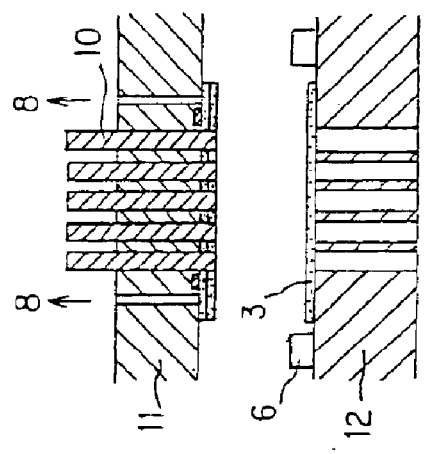
Figure 12F:
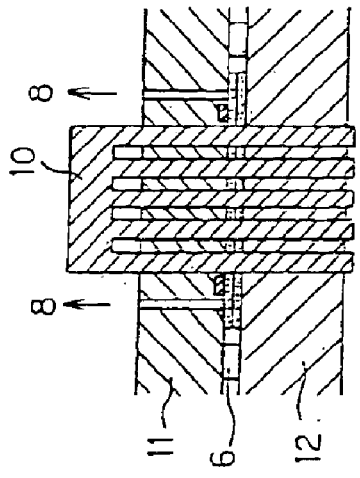

FIG. 12(d) illustrates a second punching step for punching the second plate 3. In a similar fashion in the first punching step in FIG. 12(b), the stripper 11 does not abut directly against the second plate 3, but abuts against the second external shim 6, thereby preventing the second punched plate 3 from being deformed and allowing it to have a similarly precise bore. Similarly in the second preparing step, in a third preparing step illustrated in FIG. 12(e), the third external shim 6 is placed on the die 12, wherein the third external shim 6 has a preferable thickness greater than the total thickness of the punched first and second plates 3, which both have been pulled up while leaving the punch 10 in the first and second punched plate plates 3, and the third plate 3 on the die 12 to be punched by about 5 to 15 µm, thereby preventing the stripper 11 from abutting directly against the third plate 3 in punching. Repeating these steps allows a plurality of the punched plates 3 to be stacked sequentially in the punching machine. As illustrated in FIG. 12(f), punching and stacking all plates 3, and removing the stacked plates 3 from the stripper 11 completes the punching process.

As long as the following condition is satisfied, that is, when punching the plate 3 with the punch 10, the thickness of the external shim 6 placed on the die 12 is always greater than the total thickness of the plates 3 lying between the die 12 and the stripper 11, i.e., the total thickness of the punched plates 3 having been pulled up while leaving the punch 10 in the punched plates 3 and the plate 3 on the die 12 to be punched, by about 5 to 15 µm, one of the external shims 6 prepared for the corresponding total thickness of the stacked plates 3 may be set on the die 12 depending on the number of the stacked plates 3 or alternatively the external shims 6 may be stacked one after another on the die 12 whenever each plate 3 is placed on the die 12.

There is no limitation to the shape of the foregoing external shim 6 used as a spacer. The external shim 6 may consist of a plurality of square rods or flat plates closely placed along the side faces of the plate 3 or may consist of thin circular columns or square columns placed at the four corners of the plate 3. However, the external shim 6 preferably has a frame shape shown in FIG. 15 since the same thickness thereof can be easily achieved around the overall surface thereof and thus the good parallel form between the die 12 and the stripper 11 can be easily achieved.

FIGS. 13(a) to 13(f) illustrate a fabrication method in which an elevation shim is used as another exemplary spacer. An elevation shim 5 shown in FIGS. 13(a) to 13(f) adjusts the height thereof projecting from the upper surface of the die 12 by moving up and down in the die 12, and forms the spacing between the die 12 and the stripper 11 for punching the plate 3 with the punch 10 so as to prevent the stripper 11 from abutting directly against the plate 3 and thus to prevent the plate 3 from being compressed.

Figure 13A:
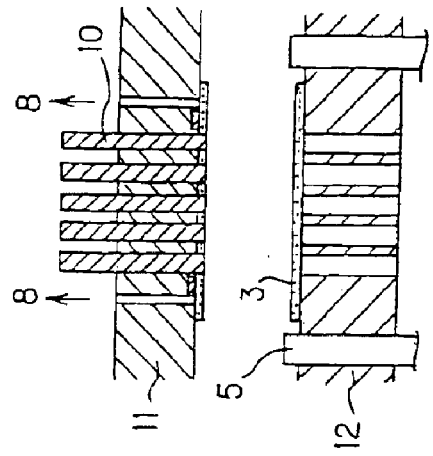
Figure 13B:
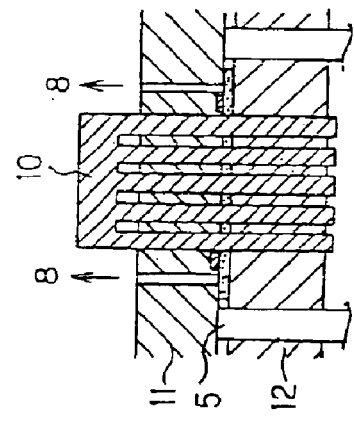
Figure 13C:
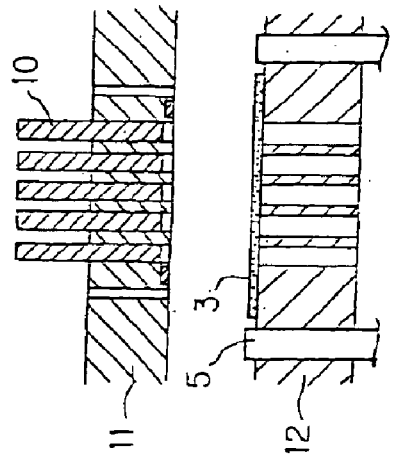

FIG. 13(a) illustrates a first preparing step in which the first thin plate 3 to be punched is placed on the die 12. In this step, the elevation shim 5 is moved up so as to project from the upper surface of the die 12 and exceed the upper surface of the plate 3 by about 5 to 15 µm. FIG. 13(b) illustrates a first punching step in which the first plate 3 is punched by the punch 10. In this step, the stripper 11 does not abut directly against the first plate 3, but abuts against the elevation shim 5 slightly projecting from the upper surface of the plate 3, thereby preventing the first plate 3 from being deformed in punching even when the first plate 3 is made from an extremely soft material, resulting in a precise bore formed in the first plate 3 by punching. Then, in the second preparing step for punching the second plate 3 as shown in FIG. 13(c), the first punched plate 3 is pulled up by closely attaching it to the stripper 11 while leaving the punch 10 in the first punched plate 3. The height of the elevation shim 5 projecting from the upper surface of the die 12 is adjusted so that the projected height of the elevation shim 5 is greater than the total thickness of the first punched plate 3, which has been pulled up while leaving the punch 10 in the first punched plate 3, and the second plate 3 on the die 12 to be punched by about 5 to 15 μm.

Figure 13D:
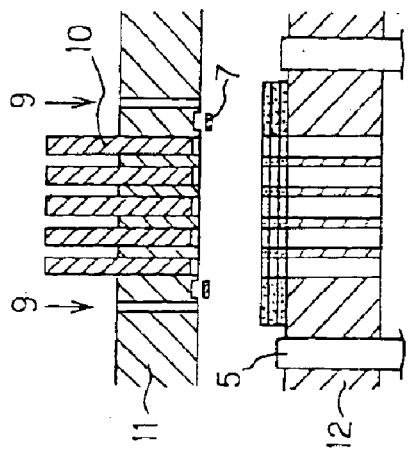
Figure 13E:
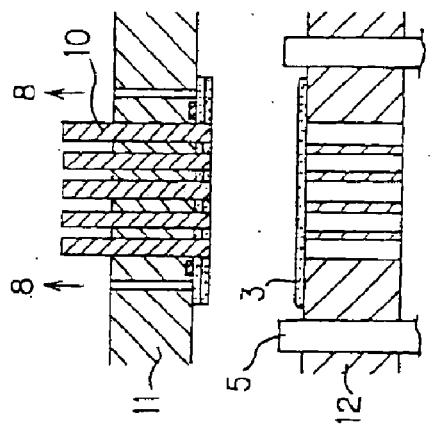
Figure 13F:
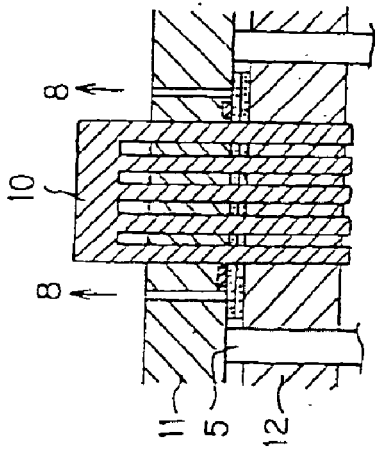
Figure 14:
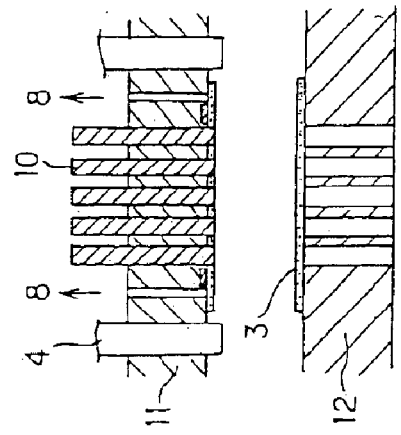
Figure 14:
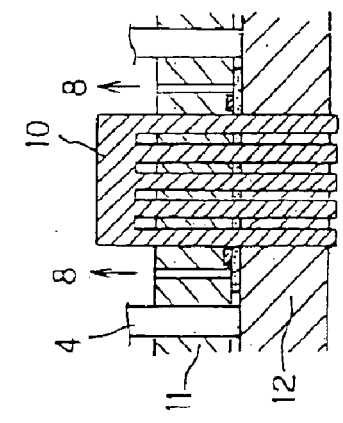
Figure 14:
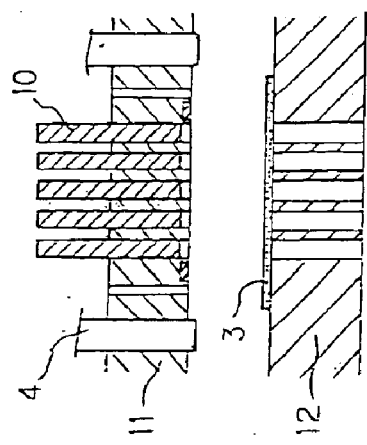
Figure 14:
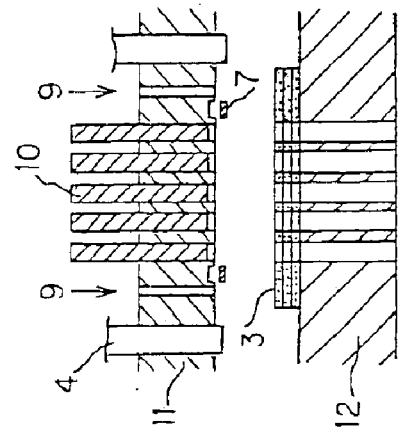
Figure 14:
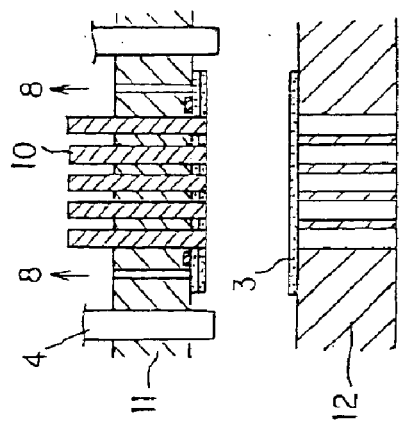
Figure 14:
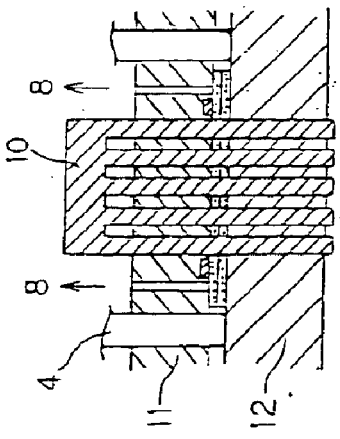

FIG. 13(d) illustrates a second punching step in which the second plate 3 is punched. In a similar fashion in the second punching step for the first plate 3 shown in FIG. 13(b), the stripper 11 does not abut directly against the second plate 3, but abuts against the elevation shim 5, thereby preventing the second plate 3 from being deformed, similarly resulting in a precise bore formed in the second plate 3. Then, in a third preparing step for punching the third plate 3 as illustrated in FIG. 13(e), similarly the elevation shim 5 projected from the upper surface of the die 12 is adjusted so that the projected height of the elevation shim 5 is greater than the total thickness of the first and second punched plates 3, which have been pulled up while leaving the punch 10 in the first and second punched plates 3, and the third plate 3 on the die 12 to be punched by about 5 to 15 μm, thereby preventing the stripper 11 from abutting directly against the third plate 3 in punching. Repeating these steps allows a plurality of the punched plates 3 to be stacked sequentially in the punching machine. As illustrated in FIG. 13(f), punching and stacking all the plates 3 and removing the stacked plates 3 from the stripper 11 completes the punching process.

There is no limitation to the shape of the elevation shim 5 used as a spacer. An elevation shim used as a spacer is not limited to the elevation shim 5 shown in FIGS. 13(a) to 13(f) which moves up and down in the die 12, but may be another elevation shim 4 moving up and down in the stripper 11 as shown in FIGS. 14(a) to 14(f). FIGS. 14(a) to 14(f) illustrate a fabrication method of a multilayer board, in which the elevation shim 4 is used.

The elevation shim 4 shown in FIGS. 14(a) to 14(f) adjusts the height of the elevation shim 4 projecting from the lower surface of the stripper 11 by moving up and down in the stripper 11, and forms the spacing between the die 12 and the stripper 11 for punching with the punch 10 so as to prevent the stripper 11 from abutting directly against the plate 3, and thus to prevent the plate 3 from being compressed.

Since the role of the elevation shim 4 as a spacer and the detailed fabrication method in which the elevation shim 4 is used are similar to the role of the elevation shim 5 and the fabrication method illustrated in FIGS. 13(a) to 13(f) in which the elevation shim 5 is used, repetitive description about the fabrication method is omitted.

Materials suitably used for the multilayer board according to the present invention will be described. A perforation in a plate having a predetermined thickness formed by known die-punching, laser processing, drilling, or the like has a limited precision, and the thicker the thickness of the plate, the more the precision of the perforation deteriorates. In particular, since chips generated by drilling are discharged through the perforation produced by drilling, the precision of the perforation formed in a plate made from a soft or deformable material deteriorates significantly. On the other hand, in the multilayer board having precise perforations fabricated by the foregoing methods according to the present invention, a plate made from a soft and deformable material such as a plastic resin, an insulating material comprising a ceramic, or an insulating composite material of a plastic resin and a ceramic, having a Young's modulus not greater than 3000 kgf/mm$^2$ and also a tensile strength not greater than 20 kgf/mm$^2$, has an excellent precision of the surface profile thereof, i.e., not greater than 8 μm. Although a ceramic is generally fabricated in a process in which raw ceramic power added with a plasticizer is formed and sintered, the ceramic recited in the specification includes not only a sintered ceramic, but also a green ceramic which is formed after adding a plasticizer to raw ceramic powder.

For example, materials such as polyethylene having a Young's modulus of 310 kgf/mm$^2$ and a tensile strength of 3 kgf/mm$^2$, polyimide having a Young's modulus of 430 kgf/mm$^2$ and a tensile strength of 18.3 kgf/mm$^2$, reinforced plastic having a Young's modulus of 2500 kgf/mm$^2$ and a tensile strength of 19 kgf/mm$^2$, and a green sheet having a Young's modulus of 7.1 kgf/mm$^2$ and a tensile strength of 0.7 kgf/mm$^2$ are included. In addition, the present invention is directed to all materials, for example, an extremely thin flat metal, having dimensions or shapes which cause the materials to be deformed by handling after the punching operation even when the materials have a Young's modulus equal to or greater than 3000 kgf/mm$^2$ or a tensile strength equal to or greater than 20 kgf/mm$^2$.

Figure 2A:
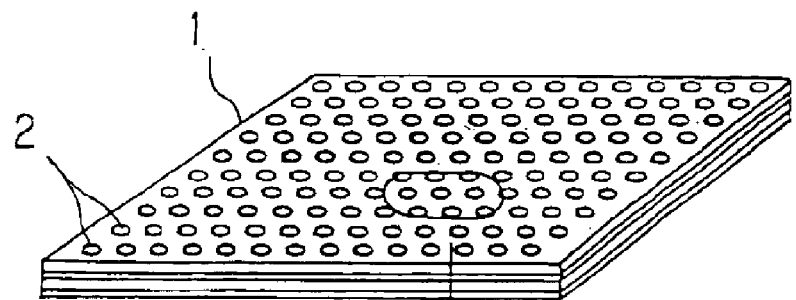
Figure 2B:
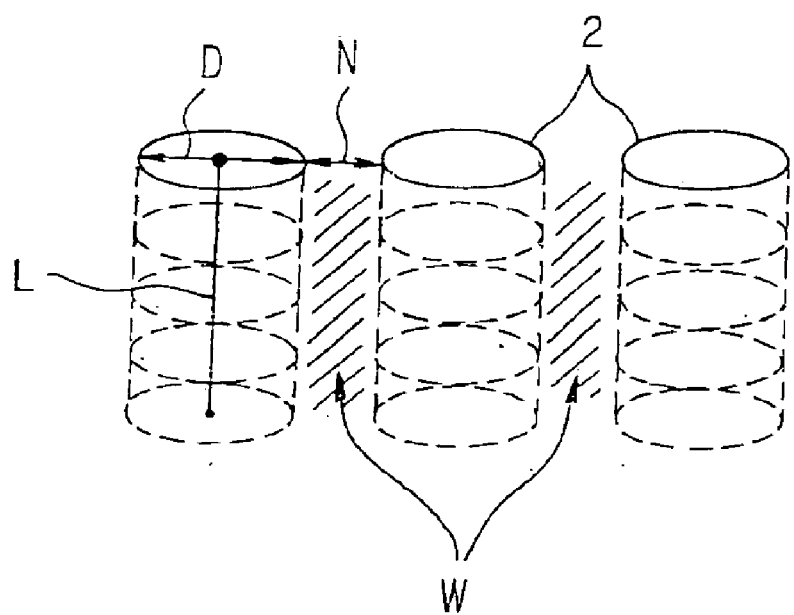
Figure 5:
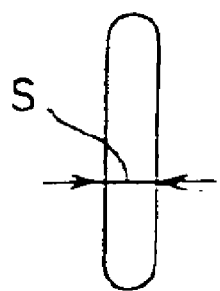
Figure 5:
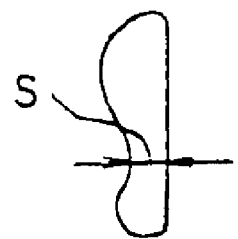

Next, perforations will be described in detail. The multilayer board according to the present invention has precise perforations even when the perforations have a high aspect ratio or a high density. By way of example, FIGS. 2(a) and 2(b) illustrate the perforations having a high aspect ratio or a high density, and the multilayer board having the precise perforations according to the present invention. FIG. 2(a) is a perspective view of the multilayer board and FIG. 2(b) is a partially enlarged view of the multilayer board.

A surface-profile precision representing a high precision is stated in B0621 "Definition and Denotation of Geometrical Deviation" in the Japanese Industrial Standard. The surface profile is represented by a surface designated so as to have a functionally predetermined shape, and the surface-profile precision is represented by a deviation from the geometrical profile defined by the theoretical geometry.

Figure 6:
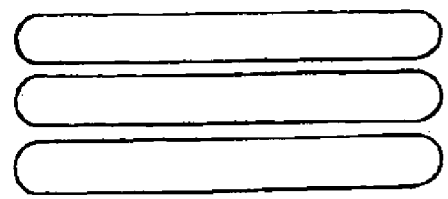
FIG. 6 is an illustration of exemplary sectional shapes of the precise perforations according to the present invention.
Figure 7:
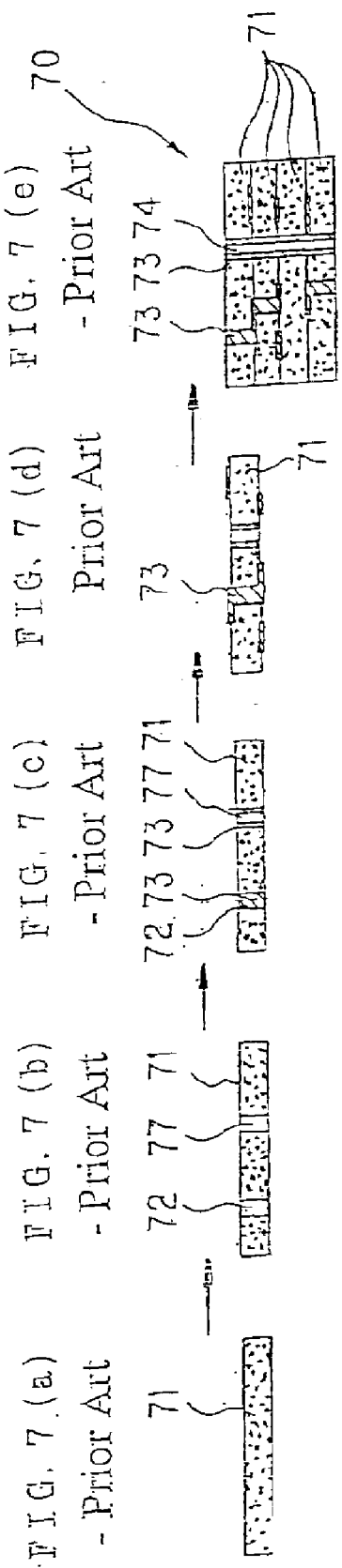
FIGS. 7(a) to 7(e) illustrate an example of a known method for fabricating a circuit substrate.
Figure 8:
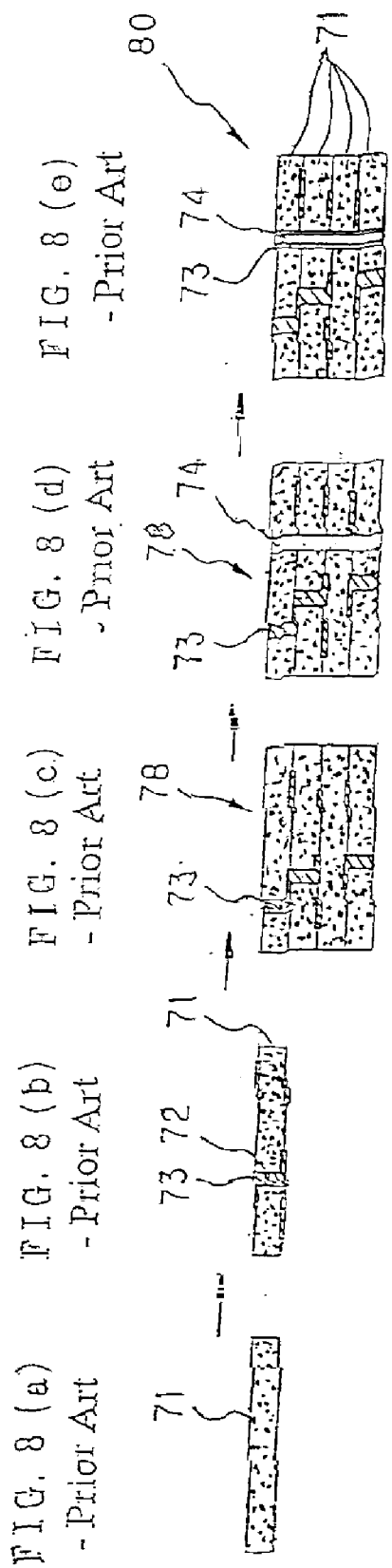
FIGS. 8(a) to 8(e) illustrate another example of a known method for fabricating a circuit substrate.

In other words, a precise perforation 2 is defined such that the diameter D thereof is substantially the same along the entire axial length L of the perforation 2 and also the perforation 2 is not placed out of position. The perforation 2 is a bore straightly passing through the plates in a depth direction of the plates. When the cross-section of the perforation 2 is round, for example, the perforation 2 is a substantially cylindrical bore. The cross-section of the perforation 2 is not limited to a round shape, but may be a long narrow ellipse as shown in FIG. 6, or any other shape. Forming the perforations 2 densely having a low surface-profile precision may cause the spacing N between the adjacent perforations 2 to be reduced and eventually two or more perforations 2 to be combined into one, or may cause the reduced spacing N of the perforation 2 to provide an insufficient strength to the plate, resulting in deformation such as flection or breakage of the wall W between adjacent perforations 2, and leading to significant damage of the reliability of a multilayer board 1. However, the multilayer board 1 having the precise perforations 2 according to the present invention is free from these problems even when the walls W are thin.

In the multilayer board 1 shown in FIG. 2(b), an aspect ratio is represented by the ratio of the axial length L to the diameter D of the perforation 2, and the density of perforations is related to the ratio of the axial length L of the perforation 2 to the spacing N between the adjacent perforations 2. The longer the axial length L relative to the diameter D, the greater the aspect ratio of the perforation 2 is, and the greater the axial length L relative to the spacing N, the higher the density of the perforations 2 is.

Circuit substrates will be described by way of specific examples. First a printed wiring board will be described in detail. As its sectional view is illustrated in FIG. 10, a multilayer printed wiring board 110 is a circuit board having the same structure with that of a known multilayer printed wiring board 100. A through-hole 74 is substantially cylindrical and has a diameter of about 50 to 100 $\mu$m, an axial length of about 500 to 1000 $\mu$m, and an aspect ratio of about 1:10. The difference between the multilayer printed wiring board 110 and the known multilayer printed wiring board 100 lies in that the through-hole 74 passing through all layers of the multilayer printed wiring board 110 has a surface having a surface-profile precision of 8 $\mu$m or less.

The through-hole 74 is provided with conductivity for electrical communication of the outermost layers of stacked conductors 73 with each other. To extend the life time and improve the reliability of the circuit substrate, occurrence of an electrical disconnection or an increase in electrical resistance must be prevented. In the known multilayer printed wiring board 100, steps caused by misaligned stacking of insulators 71 remain on the inner surface of the through-hole 74, accordingly a crack and the like are likely to occur in fabrication or operation due to an external disturbance such as thermal expansion or stress, and there is a limitation for improving yields, thereby causing a problem of a reduced product life, i.e., the reliability over the long term.

In the multilayer printed wiring board 110 according to the present invention, since the precise through-hole 74 has substantially no steps on the inner surface, as indicated by the fact in which the precision of the surface profile of the through-hole 74 is equal to or less than 8 $\mu$m, and thus does not narrow or widen practically in an axial direction thereof beyond a designed tolerable value, cracking and stripping a conductor are prevented, and an electrical disconnection, an increase in electrical resistance, insufficient insulation, and so forth are avoided. Furthermore, excellent smoothness of the inner surface of the through-hole 74 prevents the increase in resistance of the conductor 73, formations of an inductance circuit and a capacitance circuit, and generation of noise. As a result, the multilayer printed wiring board 110 has an extended life time of the circuit substrate, improved reliability over the long term, and a possibility of stacking several tens of layers, thereby being applicable to a circuit substrate which is mounted on a computer packaged more densely.

(ii) First Exemplary Method for Fabricating Circuit Substrate According to Present Invention By following the method for fabricating the multilayer board according to the present invention described in (i), the above-described multilayer printed wiring board 110 can be fabricated by the punching machine as will be described below. FIGS. 11(*a*) to 11(*f*) illustrate an exemplary method for fabricating the multilayer printed wiring board according to the present invention. As shown in FIG. 11(*a*), the required number of the flat insulators 71 made from, for example, an epoxy resin and glass cloth are prepared in a preparing step. The insulators 71 are preferably provided with flame resistance by, for example, mixing a Br-base fire resistant with the material of the insulators 71. In a circuit forming step shown in FIG. 11(*b*), via-holes 72 are formed in the insulators 71, the conductors 73 are provided in the via-holes 72, and the insulators 71 have respective required circuits thereon connected with the conductors 73, thus providing a required number of single-layer wiring boards 79. For example, copper, an alloy of copper, aluminum, or an alloy of aluminum is suitably used for the conductors 73. Also, the circuits are formed by a chemical process (photo etching), including known resist-applying, exposing, developing, and etching, in addition to known screen-printing, plating, and so forth.

In first and third perforating and stacking steps shown in FIGS. 11(*c*) and 11(*d*), the single-layer wiring boards 79, which are also indicated as the insulators 71 in FIGS. 11(*b*) to 11(*d*), and which have the previously designed circuits formed thereon in the step shown in FIG. 11(*b*), are stacked for providing a laminate 108. As shown in FIG. 11(*c*), the punching machine having the punch 10 and the die 12 forms a first hole in the first wiring board 79 with the punch 10, pulls up the first wiring board 79 by closely attaching it to the stripper 11 while leaving the punch 10 the first hole. Then, the punching machine forms a second hole in the second wiring board 79 with the punch 10, pulls up the second wiring board 79 together with the first wiring board 79 while leaving the punch 10 in the second hole, and thus repeats perforating the following wiring boards 79 and stacking them along the punch 10 serving as a stacking axis alternately as shown in FIG. 11(*d*), leading to the laminate 108 in a final step for completing the punching and stacking process as shown FIG. 11(*e*).

When the insulators 71 are made from a soft, deformable material, interposing a spacer between the die 12 and the stripper 11 is preferable for punching, after the model of the method for fabricating the multilayer board according to the present invention as described in (i).

Then, in a conductive-path forming step as shown in FIG. 11(*f*), the conductive film 73 is formed on the inner surface of the through-hole 74 by plating copper, for example, thus the multilayer printed wiring board 110 having the conductive though-hole 74 passing through from the top to the bottom thereof is obtained. Following this step, sealing the through-hole 74 with filler such as an epoxy resin is desirable.

The advantages of the improved yields and reliability over the long term thanks to the precise through-hole having an excellent surface-profile precision of 8 $\mu$m or less are effective not only on the above-described multilayer printed wiring board, but also on other various circuit substrates such as a build-up wiring board, a semiconductor package, a printed wiring board for packaging, a multi-up module, a metal-core printed wiring board, a multilayer flexible printed wiring board, a thin-plate multilayer printed wiring board, and a double-sided wiring board.

A material such as epoxy, glass epoxy, polyimide, glass polyimide, glass bis-maleimide triazine, triazine, ceramic, polyethylene terephthalate, or polyfluoroethylene is used for the insulators of these circuit substrates. These materials and composite materials of two or more of the above are suitable for punching and stacking by the first exemplary method for fabricating the circuit substrate according to the present invention as described in (ii).

Referring now to FIG. 1, a build-up wiring board as another exemplary circuit substrate will be described. As a flip chip technology for mounting a semiconductor bare-chip and connecting the chip and a circuit substrate has been introduced, a higher wiring density is required. As its sectional view is illustrated in FIG. 1, a build-up wiring board 101 as a circuit substrate mounted on a computer has offered a breakthrough to overcome a limitation of the higher wiring densities and has replaced a conventional multilayer printed wiring board.

The build-up wiring board 101 comprises a base substrate 22 and a build-up layer 21 formed on at least one surface of the base substrate 22; however, usually two build-up layers 21 are formed on both surfaces of the base substrate 22 as shown in FIG. 1. The base substrate 22 has substantially the same structure with that of a typical multilayer printed wiring board. That is, the base substrate 22 is constructed such that a plurality of layers of the insulators 71 insulating the adjacent conductors 73 is stacked, the insulator 71 is formed from a plate made from, for example, an epoxy resin, glass cloth, etc., and the conductor 73 is made from, for example, copper, aluminum, etc., so as to form a circuit.

The base substrate 22 has the through-hole 74 formed therein passing through all the layers thereof. The through-hole 74 is provided with conductivity by plating copper serving as the conductor 73 on the inner surface of the through-hole 74, so that the outermost layers of the base substrate 22 are in electrical communication with each other. The through-hole 74 is often sealed by a sealant 75 such as an epoxy resin. The through-hole 74 is substantially cylindrical, has a diameter of about 50 to 100 μm and an axial length, i.e., a thickness of the base substrate 22, of about 500 to 1000 μm, and an aspect ratio of about 10:1.

The build-up wiring board 101 according to the present invention is characterized in that the through-hole 74 passing through all the layers of the base substrate 22 is highly precise and the surface-profile precision is equal to 8 μm or less. Therefore, similarly in the foregoing multilayer printed wiring board 110, in the build-up wiring board 101 according to the present invention, the through-hole 74 has substantially no steps on the inner surface and thus does not narrow or widen practically in an axial direction thereof beyond a designed tolerable value, accordingly cracking and stripping a conductor are prevented, and an electrical disconnection, an increase in electrical resistance, insufficient insulation, and so forth are avoided, even when an external disturbance such as thermal expansion or stress is generated during fabricating or operating the build-up wiring board 101. Furthermore, excellent smoothness of the inner surface of the through-hole 74 prevents the increase in resistance of the conductor 73, formations of an inductance circuit and a capacitance circuit, and generation of noise. As a result, the build-up wiring board 101 is suitable for a circuit substrate for a computer in which minute electric current flows.

Each of the build-up layers 21 comprises at least two alternately stacked layers of a conducting layer 83 and the insulating layer 81 for insulating the conducting layers 83 so as to form a high density circuit together with the base substrate 22. The innermost layer of the build-up layer 21 is connected to the outermost layer of the base substrate 22 and is in electrical communication with that of the opposite build-up layer 21 via the through-hole 74 of the base 22, thereby forming a circuit as a combined unit of the build-up layer 21, the base substrate 22, and the opposite build-up layer 21.

(iii) Second Exemplary Method for Fabricating Circuit Substrate according to the Present Invention The build-up wiring board 101 according to a second exemplary method is fabricated as will be described below. First, after the model of the first exemplary method for fabricating the circuit substrate according to the present invention described in (ii), the base substrate is formed by the punching machine (not shown). A required number of flat insulators 71 made from an epoxy resin, glass cloth, and so forth are prepared. By using the conductor, required circuits are formed on the respective insulators by photo etching, screen printing, plating, and so forth so as to offer a required number of single-layer wiring boards. Repeating perforating the single-layer wiring boards having the previously designed circuits and stacking the formed wiring boards along the punch serving as a stacking axis by using the punching machine provides a laminate having a through-hole. Then, forming a conductive film on the inner surface of the through-hole, for example, by plating copper, aluminum, and the like, offers a base substrate having the conductive through-hole passing through from the top to the bottom thereof.

Then, the build-up layer is formed on the obtained base substrate by the semiconductor fabrication technologies, that is, by alternately stacking the conducting layers and the insulating layers mainly through the chemical processes such as applying an insulating material, exposing and developing, etching, and plating. Since the build-up layer is formed on the basis of the semiconductor fabrication technologies, it has a circuit formed more densely than the base substrate. As a result, the build-up layer has a higher density circuit formed thereon and the base substrate often has a lower density power circuit formed thereon, and from the viewpoint of such a circuit design, the build-up wiring board 101 according to the present invention is different from a typical multilayer printed wiring board.

What is claimed:

1. An intermediate laminated structure comprising a plurality of unfired ceramic plates stacked along a laminating direction, each of said plates having a plurality of holes formed therethrough by a punching operation, wherein at least a first hole in one of said plurality of unfired ceramic plates has the same shape and cross-sectional area as respective first holes in the remaining plurality of unfired ceramic plates such that said first holes define a cylinder of constant cross-sectional area throughout the entire thickness of said intermediate laminated structure.

2. The intermediate laminated structure according to claim 1, wherein each of said plurality of holes in said one of said plurality of unfired ceramic plates has the same shape and cross-sectional area as respective holes in the remaining plurality of unfired ceramic plates such that said holes define a plurality of cylinders of constant cross-sectional area throughout the entire thickness of said intermediate laminated structure.

3. The intermediate laminated structure according to claim 2, wherein a ratio of an axial length of each said cylinder to a diameter of said cylinder, or a ratio of an axial length of said cylinder to a minimum distance between opposing edges on an opening surface of said cylinder, is in a range of about 1:1 to about 15:1.

4. The intermediate laminated structure according to claim 2, wherein a ratio of an axial length of each said cylinder to a space between said cylinder and adjacent cylinders is in a range of about 1:1 to about 15:1.

5. The intermediate laminated structure according to claim 2, wherein a diameter of each said cylinder, or a minimum distance between opposing edges on an opening surface of each said cylinder, is less than or equal to 100 μm.

6. The intermediate laminated structure according to claim 2, wherein a space between adjacent cylinders is less than or equal to 100 μm.

7. The intermediate laminated structure according to claim 1, wherein said unfired ceramic plates comprise a compound insulating material comprising a plastic resin and a ceramic material.

8. An intermediate laminated structure comprising a plurality of unfired ceramic plates stacked along a laminating direction, each of said plates having a plurality of holes formed therethrough by a punching operation;

wherein at least a first hole in one of said plurality of unfired ceramic plates has the same shape and cross-sectional area as respective first holes in the remaining plurality of unfired ceramic plates such that said first holes define a cylinder of constant cross-sectional area throughout the entire thickness of said intermediate laminated structure; and wherein said unfired ceramic plates have a Young's modulus of 3000 kgf/mm² or less and a tensile strength of 20 kgf/mm² or less.

9. An intermediate laminated structure comprising a plurality of unfired ceramic plates stacked along a laminating direction, each of said plates having a plurality of holes formed therethrough by a punching operation, wherein at least a first hole in one of said plurality of unfired ceramic plates has the same shape and cross-sectional area as respective first holes in the remaining plurality of unfired ceramic plates such that said first holes define a cylinder of constant cross-sectional area throughout the entire thickness of said intermediate laminated structure, wherein said intermediate laminated structure is fabricated by a method comprising the steps of:

providing a punching machine comprising at least one punch, a die, and a stripper;

providing a predetermined number of said unfired ceramic plates;

forming at least a first hole in a first unfired ceramic plate with said punch and pulling up said first unfired ceramic plate by closely attaching said first unfired ceramic plate to said stripper while leaving said punch in said first hole;

forming at least a first hole in a second unfired ceramic plate with said punch and pulling up said second unfired ceramic plate together with said first unfired ceramic plate while leaving said punch in said second hole; and forming first holes in the remaining unfired ceramic plates and sequentially stacking the punched unfired ceramic plates along said punch as a stacking axis.

10. The intermediate laminated structure according to claim 9, wherein each of said plurality of holes in said one of said plurality of unfired ceramic plates has the same shape and cross-sectional area as respective holes in the remaining plurality of unfired ceramic plates such that said holes define a plurality of cylinders of constant cross-sectional area throughout the entire thickness of said intermediate laminated structure.

11. An intermediate laminated circuit substrate comprising:

a plurality of insulators comprising unfired ceramic plates; and a plurality of conductors formed on said insulators; and at least one cylinder defined by a plurality of first holes formed in each of said insulators and conductors by a punching operation and passing through all of said insulators and conductors, wherein at least a first hole in one of said plurality of insulators and conductors has the same shape and cross-sectional area as respective first holes in the remaining plurality of insulators and conductors such that said cylinder has a constant cross-sectional area throughout the entire thickness of said intermediate laminated circuit substrate.

12. The intermediate laminated circuit board substrate according to claim 11, wherein each of said plurality of holes in said one of said plurality of insulators and conductors has the same shape and cross-sectional area as respective holes in the remaining plurality of said insulators and conductors such that said holes define a plurality of cylinders of constant cross-sectional area throughout the entire thickness of said intermediate laminated circuit substrate.

13. The intermediate laminated circuit substrate according to claim 12, wherein a ratio of an axial length of each said cylinder to a diameter of said cylinder, or a ratio of an axial length of each said cylinder to a minimum distance between opposing edges on an opening surface of said cylinder, is in a range of about 1:1 to about 15:1.

14. The intermediate laminated circuit substrate according to claim 12, wherein a ratio of an axial length of each said cylinder to a space between said cylinder and adjacent cylinders is in a range of about 1:1 to about 1:15.

15. An intermediate laminated circuit substrate comprising:

a plurality of conductors, a plurality of insulators for insulating said conductors stacked together with said conductors, said insulators comprising unfired ceramic plates, and at least one cylinder defined by a plurality of first holes formed in each of said insulators and conductors by a punching operation and passing through all of said insulators and conductors, wherein at least a first hole in one of said plurality of insulators and conductors has the same shape and cross-sectional area as respective first holes in the remaining plurality of said insulators and conductors such that said cylinder has a constant cross-sectional area throughout the entire thickness of said intermediate laminated circuit substrate, wherein said intermediate laminated circuit substrate is fabricated by a method comprising the steps of:

providing a punching machine comprising at least one punch, a die, and a stripper;

providing a plurality of wiring boards comprising an insulating unfired ceramic material and having respective circuits formed thereon;

forming at least a first hole in a first wiring board with said punch and pulling up said first wiring board by closely attaching said first wiring board to said stripper while leaving said punch in said first hole of said first wiring board;

forming at least a first hole in a second wiring board with said punch and pulling up said second wiring board together with said first wiring board while leaving said punch in said first hole of said second wiring board; and forming first holes in the remaining wiring boards and sequentially stacking the punched wiring boards along said punch as a stacking axis.

16. An intermediate laminated circuit substrate comprising:

a base substrate comprising a plurality of conductors, a plurality of insulators for insulating said conductors stacked together with said conductors, said insulators comprising unfired ceramic plates, and at least one cylinder defined by a plurality of first holes formed in each of said insulators and conductors by a punching operation and passing through all of said insulators and conductors, wherein at least a first hole in one of said plurality of insulators and conductors has the same shape and cross-sectional area as respective first holes in the remaining plurality of said insulators and conductors such that said cylinder has a constant cross-sectional area throughout the entire thickness of said intermediate laminated circuit substrate; and at least one build-up layer formed on at least one side of said base substrate, said build-up layer comprising at least one conducting layer and at least one insulating layer alternately stacked together with said conducting layer.

17. The intermediate laminated circuit substrate according to claim 16, wherein each of said plurality of holes in said one of said plurality of insulators and conductors has the same shape and cross-sectional area as respective holes in the remaining plurality of said insulators and conductors such that said holes define a plurality of cylinders of constant cross-sectional area throughout the entire thickness of said intermediate laminated circuit substrate.

18. The intermediate laminated circuit substrate according to claim 17, wherein a ratio of an axial length of each said cylinder to a diameter of said cylinder, or a ratio of an axial length of each said cylinder to a minimum distance between opposing edges on an opening surface of said cylinder, is in a range of about 1:1 to about 15:1.

19. The intermediate laminated circuit substrate according to claim 17, wherein a ratio of an axial length of each said cylinder to a space between said cylinder and adjacent cylinders is in a range of about 1:1 to about 15:1.

20. An intermediate laminated circuit substrate comprising:

a base substrate comprising a plurality of conductors, a plurality of insulators for insulating said conductors stacked together with said conductors, said insulators comprising unfired ceramic plates, and at least one cylinder defined by a plurality of first holes formed in each of said insulators and conductors by a punching operation and passing through all of said insulators and conductors, wherein at least a first hole in one of said plurality of insulators and conductors has the same shape and cross-sectional area as respective first holes in the remaining plurality of said insulators and conductors such that said cylinder has a constant cross-sectional area throughout the entire thickness of said intermediate laminated circuit substrate, and at least one build-up layer formed on at least one side of said base substrate, said build-up layer comprising at least one conducting layer and at least one insulating layer alternately stacked together with said conducting layer, wherein said intermediate laminated circuit substrate is fabricated by a method comprising the steps of:

providing a punching machine comprising at least one punch, a die, and a stripper;

providing a plurality of wiring boards comprising an insulating unfired ceramic material and having respective circuits formed thereon;

forming a first hole in a first wiring board with said punch and pulling up said first wiring board by closely attaching said first wiring board to said stripper while leaving said punch in said first hole of said first wiring board;

forming a first hole in a second wiring board with said punch and pulling up said second wiring board together with said first wiring board while leaving said punch in said first hole of said second wiring board;

forming first holes in the remaining wiring boards and sequentially stacking said punched wiring boards along said punch as a stacking axis to form said base substrate; and forming said build-up layer on said base substrate.

* * * * *